(12) United States Patent
Belenky et al.

(10) Patent No.: US 6,819,696 B1
(45) Date of Patent: Nov. 16, 2004

(54) INTERSUBBAND SEMICONDUCTOR LASERS WITH ENHANCED SUBBAND DEPOPULATION RATE

(75) Inventors: Gregory Belenky, Port Jefferson, NY (US); Mitra Dutta, Wilmette, IL (US); Mikhail Kisin, Lake Grove, NY (US); Serge Luryi, Setanket, NY (US); Michael Stroscio, Wilmette, IL (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 232 days.

(21) Appl. No.: 09/957,531

(22) Filed: Sep. 21, 2001

(51) Int. Cl.[7] .................................................. H01S 5/00
(52) U.S. Cl. ......................................................... 372/45
(58) Field of Search ..................... 372/43–50

(56) References Cited

U.S. PATENT DOCUMENTS

| | | | |
|---|---|---|---|
| 4,941,025 A | * 7/1990 | Tabatabaie | ............ 372/50 |
| 5,359,617 A | * 10/1994 | Kano et al. | ............ 372/45 |

* cited by examiner

Primary Examiner—Quyen Leung
(74) Attorney, Agent, or Firm—Paul Clohan; Edward Stolarun

(57) ABSTRACT

Intersubband semiconductor lasers (ISLs) are of great interest for mid-infrared (2–20 $\mu$m) device applications. These semiconductor devices have a wide range of applications from pollution detection and industrial monitoring to military functions.

ISLs have generally encountered several problems which include slow intrawell intersubband relaxation times due to the large momentum transfer and small wave-function overlap of the initial and final electron states in interwell transitions. Overall, the ISL's of the prior art are subject to weak intersubband population inversion.

The semiconductor device of the present invention provides optimal intersubband population inversion by providing a double quantum well active region in the semiconductor device. This region allows for small momentum transfer in the intersubband electron-phonon resonance with the substantial wave-function overlap characteristic of the intersubband scattering.

6 Claims, 11 Drawing Sheets

INTERSUBBAND SEMICONDUCTOR LASERS WITH ENHANCED SUBBAND DEPOPULATION RATE

GOVERNMENT INTEREST

The invention described herein may be manufactured, used and/or licensed by or for the United States Government.

BACKGROUND OF THE INVENTION

Intersubband semiconductor lasers (ISLs) are of great interest for mid-infrared (2–20 $\mu$m) device applications. They are the preferred optical source in two important windows of atmospheric transparency, namely those at 3–5 $\mu$m and 8–13 $\mu$m (See Capasso et al., Optics & Photonics News, V. 10, No. 10, pp. 32–37, 1999). Applications range from pollution detection and industrial process monitoring to military countermeasures.

As compared to interband midinfrared (lead salt) lasers, the unipolar ISL have the advantage of a higher temperature operation. An important drawback of contemporary ISL is low radiation efficiency resulting from high nonradiative intersubband electron relaxation in active quantum wells of ISL.

A number of techniques have been devised to enhance the lasing efficiency. The electron-recycling cascading scheme, in which electrons sequentially traversing N≈25 stacked active regions emit N laser photons, has been successfully used in quantum cascade (QC) ISL design (see Faist et al., Science, V. 264, No. 5158, pp. 553–556, 1994). A Bragg reflector region was incorporated in the QC ISL active region to provide strong electron confinement in the upper lasing state (see Faist et al., Applied Physics Letters, v. 66, No. 5, pp. 538–540, 1995). Plasmon-enhanced waveguide has been specially redesigned for ISL to maintain a high optical confinement and reduce optical losses for wavelengths in the second atmospheric window (Sirtori, 1995). An improvement of the device characteristics has been also achieved by special design of the injector/relaxation region, to provide for resonant carrier injection at laser threshold (see Gmachl et al., Applied Physics Letters, V. 72, No. 24, pp. 3130–3132, 1998).

Figure 1:
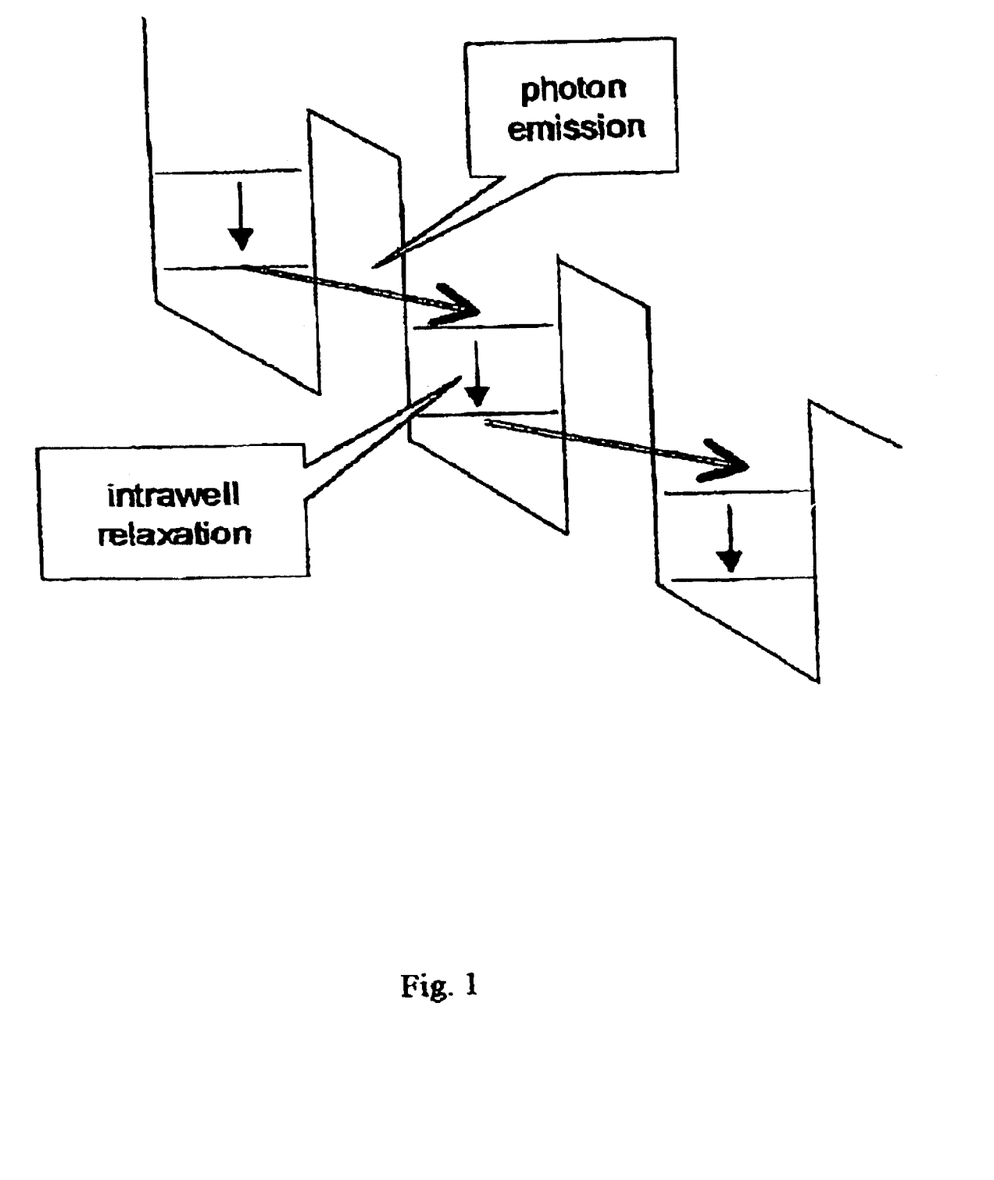
FIG. 1 shows a first prior art depopulation mechanism.
Figure 2:
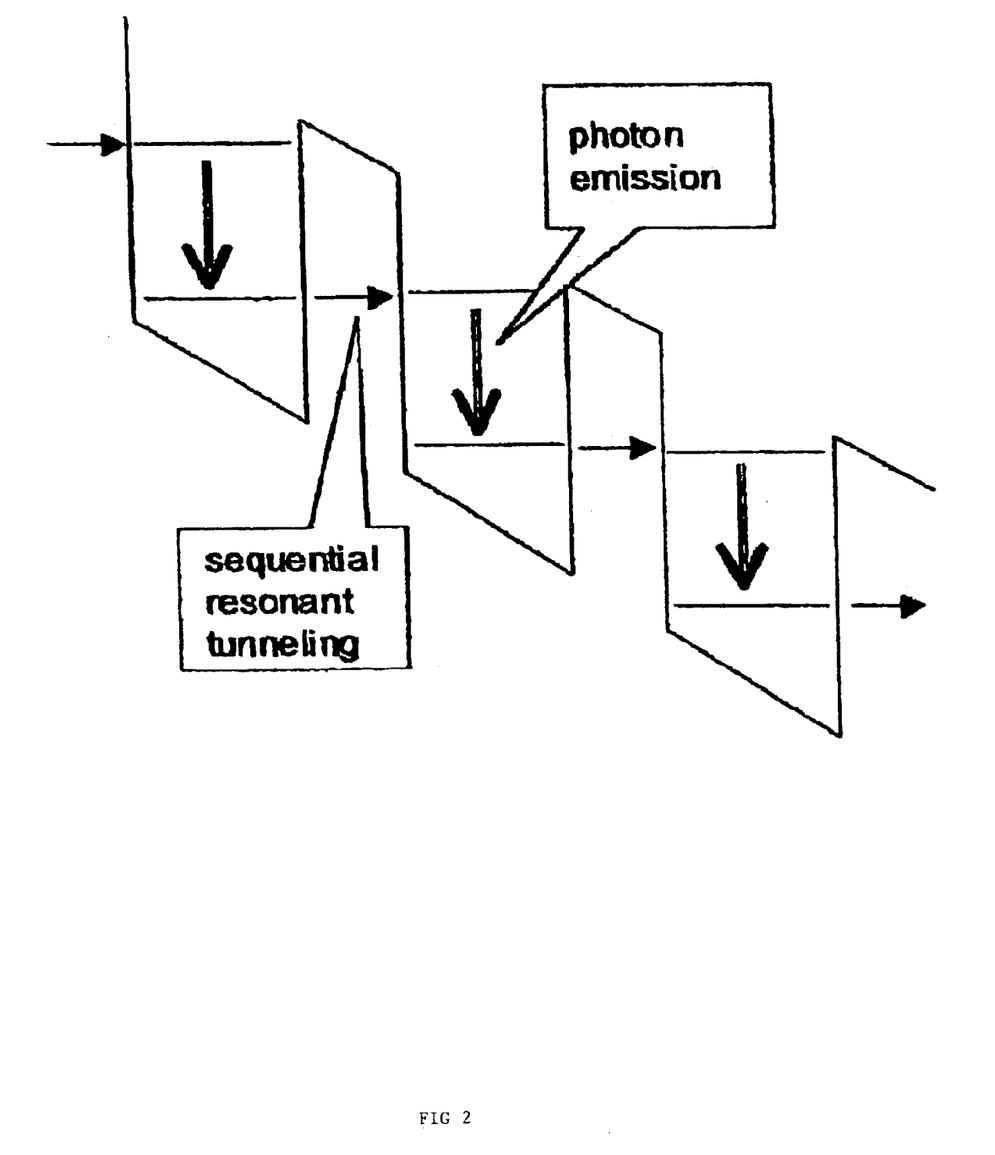
FIG. 2 shows a second prior art population/depopulation mechanism.
Figure 3:
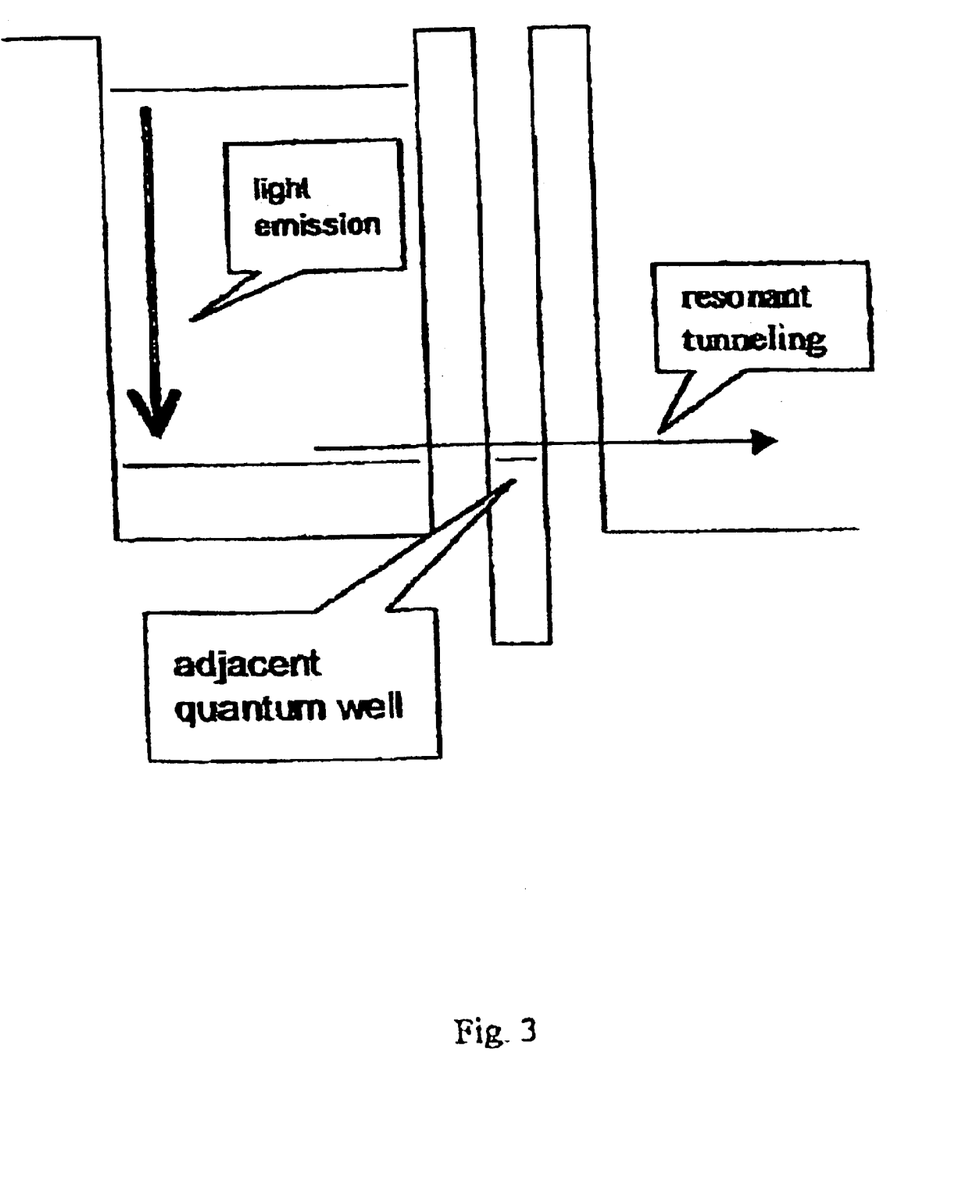
FIG. 3 shows a third prior art depopulation mechanism.

One of the ways of enhancing the lasing efficiency is to increase the optical gain in the ISL active region. The existence of optical gain is the basis for the lasing action. In the case of the ISL, the optical gain results from the inverted electronic population between the quantum subbands in the active quantum wells of the laser heterostructure. Population inversion between the lasing subbands occurs when the electron lifetime in the lower subband (the depopulation time) is shorter than the time of the intersuubband relaxation from the higher subband. In $A_3B_5$-based heterostructures the intersubband relaxation is mainly associated with the relatively fast process of LO-phonon emission. This leads to the requirement of even faster depopulation of the lower lasing subband. A number of different approaches to this problem have been proposed after the pioneering work by Kazarinov and Suris (see Kazarinov et al., Soviet Physics-semiconductors, V. 5, No. 10, pp. 707–709, 1971), where the intrawell intersubband relaxation was assumed as a depopulation mechanism for the lower lasing subband, as shown in FIG. 1, but no special relaxation process had been specified. Helm proposed using sequential resonant tunneling in multiple-quantum-well heterotructures, as illustrated in FIG. 2, as means for both populating the upper laser level and depopulating the lower one (see Helm et al., Physical Review Letters, V 63, No. 1 pp. 74–77, 1989). These structures, however, encounter serious difficulties related to charge accumulation and coordinate-dependent energy misalignment of the levels in the adjacent quantum wells (QWs). An alternative depopulation design involving resonant tunneling through an adjacent narrow quantum well, as illustrated in FIG. 3, was proposed by Borenstain and Kastalsky (see Borenstain et al., Applied Physics Letters, V. 55, No. 7, pp. 654–656, 1989; and Kastalsky et al., Applied Physics Letters, V. 59, No. 21, pp. 2636–2638, 1991). The role of resonant tunneling in this design was to perform electronic energy filtering, whereas the active double QW was separated from another pair of QWs by an ohmic n+"reservoir." The resonant tunneling depopulation mechanism employs a resonant penetration of the wavefunctions of the final electron states. However, schemes involving resonant tunneling have a disadvantage of being very sensitive to layer width fluctuation and charge build up, so they have never been implemented in the QC laser design.

Figure 4:
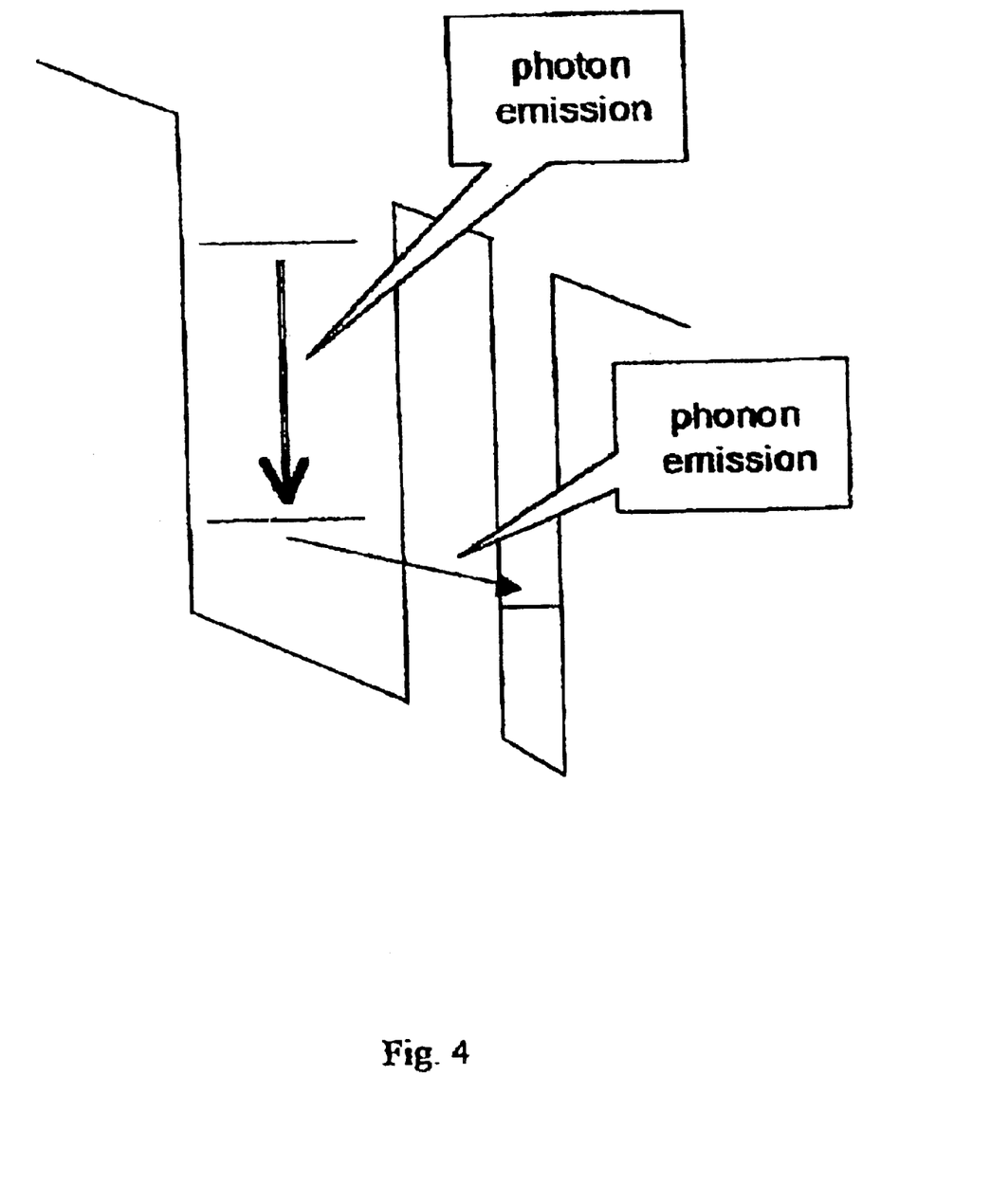
FIG. 4 shows a fourth prior art depopulation mechanism.

Interwell scattering assisted by LO-phonons has been considered as an effective mechanism for the lower subband depopulation in ISL (see Sun et al., IEEE Journal of Quantum Electronics, V. 29, No. 4, pp. 1104–1111, 1993). This mechanism was employed in the first successful implementation of the quantum cascade ISL at Bell Laboratories (see Faist et al., 1994, above). The Bell Labs group placed a "drain" level in an adjacent quantum well exactly one LO-phonon energy below the depopulated lower laser level in the active quantum well, as illustrated in FIG. 4. This design maximizes the interwell scattering mediated by long-wavelength optical phonons. Nevertheless, even in this successful design the typical depopulation time is of the same order of magnitude as the time of nonradiative intersubband relaxation. As a result, the low depopulation rate still remains a barrier for improving the ISL performance and search for a suitable solution continues in many laboratories.

Figure 5:
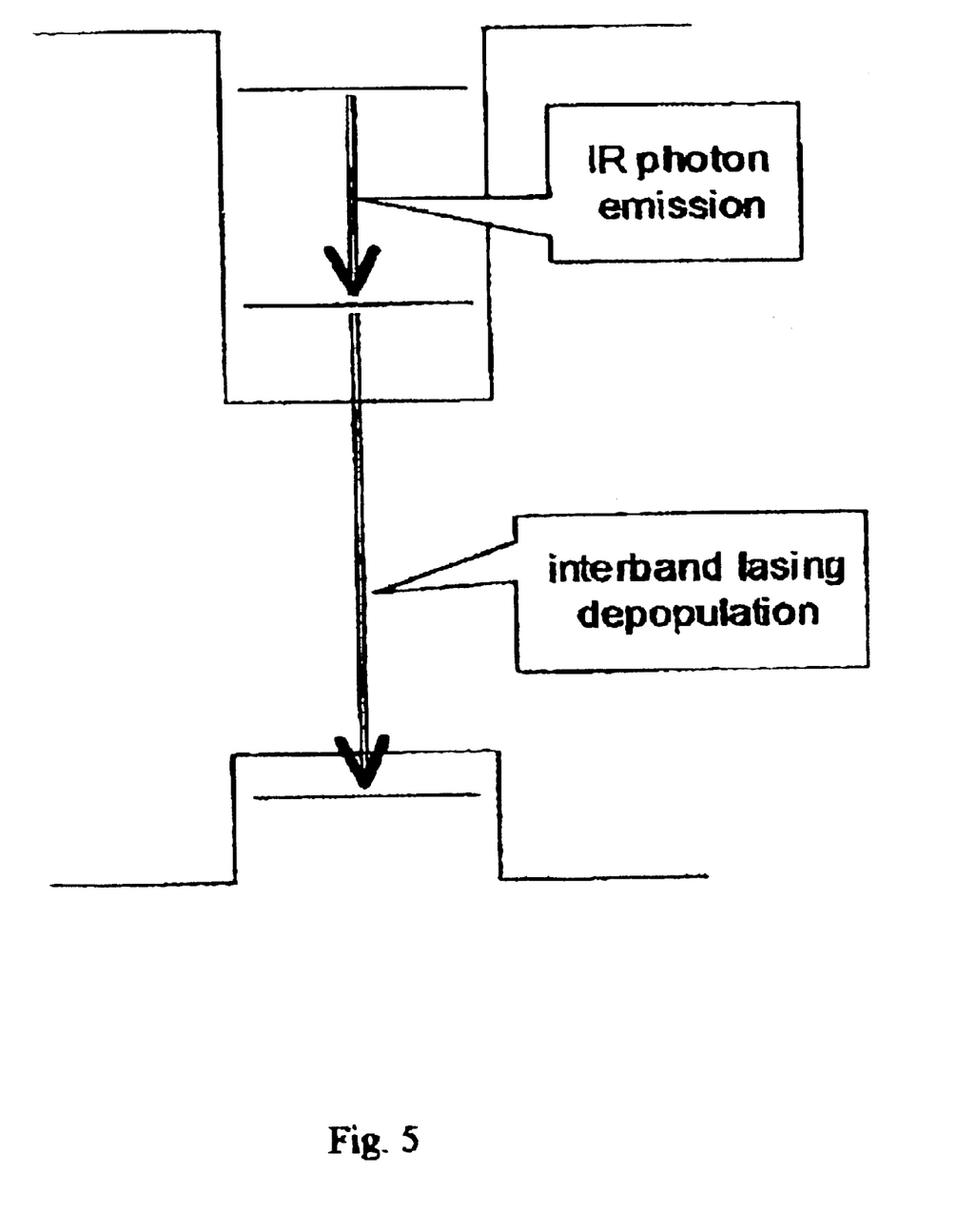
FIG. 5 shows a fifth prior art depopulation mechanism.
Figure 6:
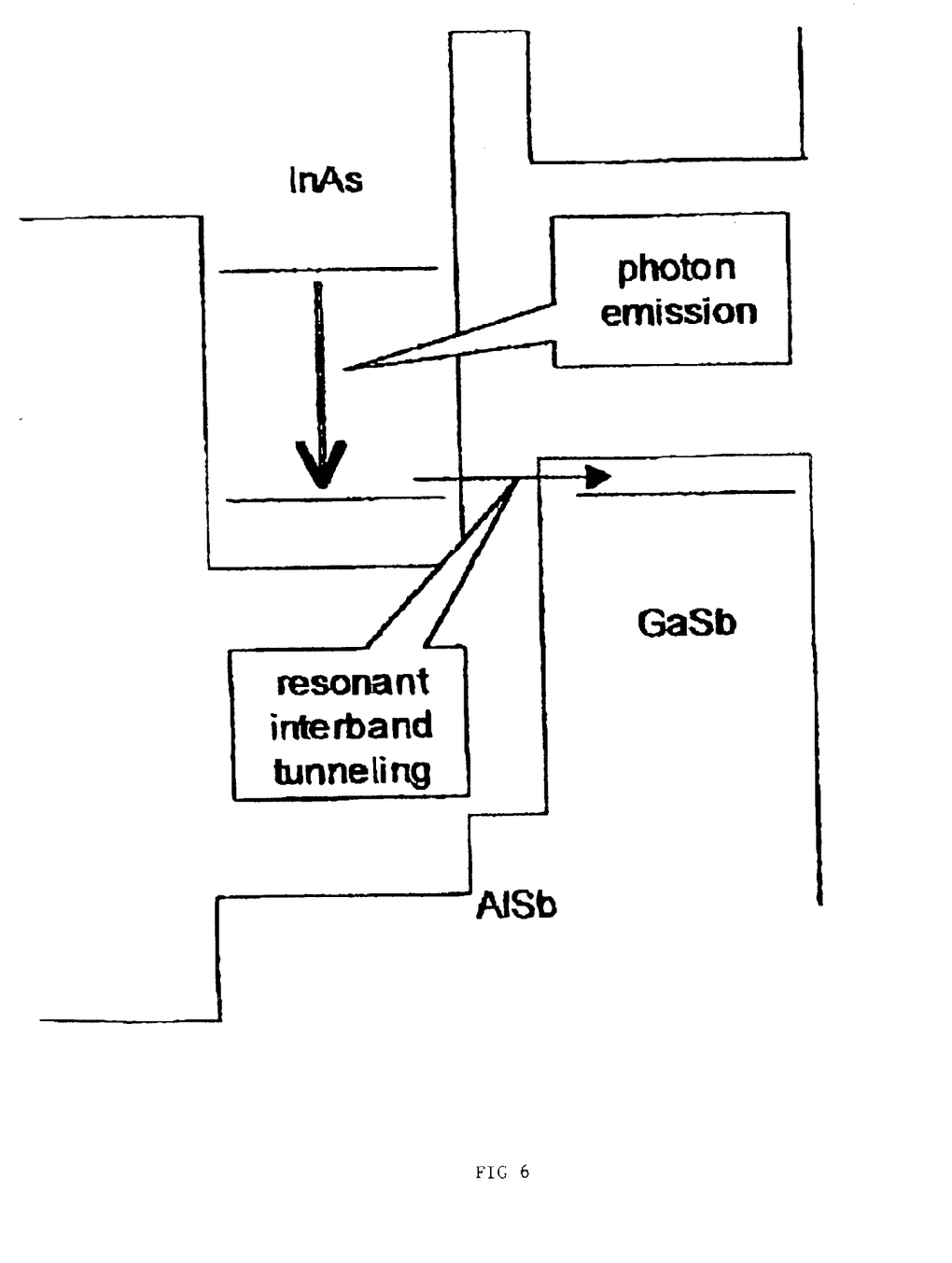
FIG. 6 shows a sixth prior art depopulation mechanism.

Other suggested methods of enhancing the depopulation rate in ISL include interband electron transitions and interband A tunneling through broken-gap heterointerface. The method of interband stimulated emission depopulation suggested by H Kastalsky (see Kastalsky et al., IEEE Journal of Quantum Physics, V. 29, No. 4, pp. 1112–1115, 1993) and illustrated in FIG. 5, is based on the incorporation of an interband laser in the same design together with the intersubband laser heterostructure, i.e. two simultaneously operating laser mechanisms in the same heterostructure. The broken-gap heterostructure, suggested by Yang (Yang et al., Applied Physics Letters, V. 59, No. 2, pp. 181–182, 1991) and illustrated in FIG. 6, requires a special type of heterostructure material —InAs/GaSb type-II interface. Mid-infrared interband cascade laser based on type-II heterostructures is a rapidly growing new class of semiconductor IR light sources (see Yang, Microelectronics Journal, V. 30, No. 10, pp 1043–1056, 1999).

Figure 7:
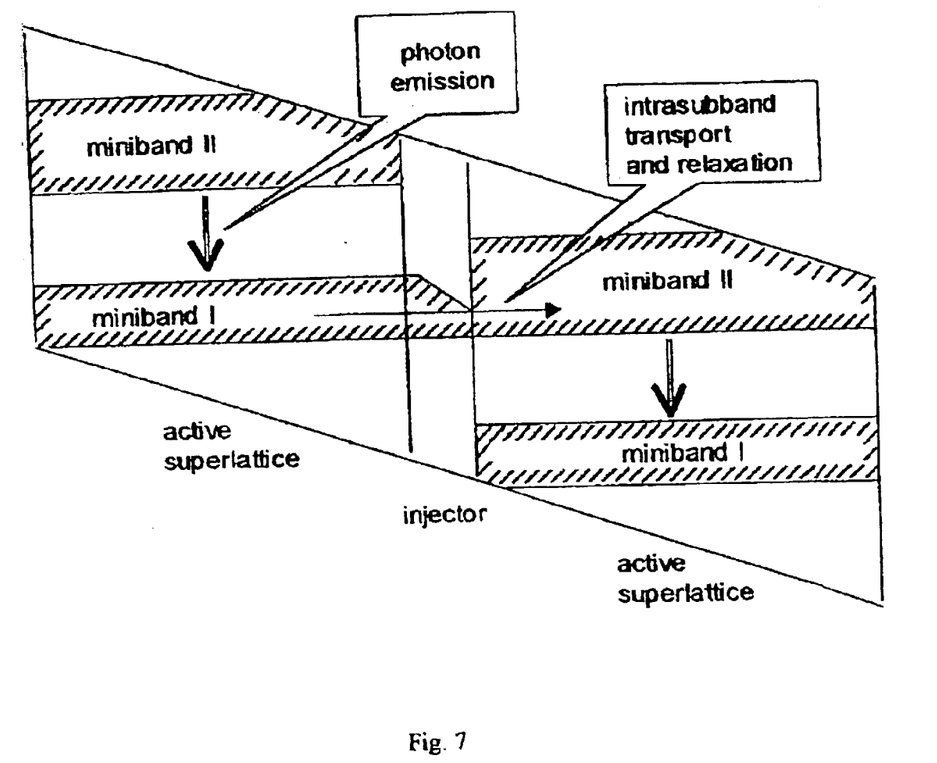
FIG. 7 shows a seventh prior art depopulation mechanism.

Still another known technique involves the use of a superlattice active region, as suggested long ago by Yuh and implemented recently in the QC laser design by Scamarcio (see Yuh et al., Applied Physics Letters, V. 51, No. 18, pp. 1404–1406, 1987; and Scamarcio et al., Science, V. 276, No. 5313, pp. 773–776, 1997). In this technique, illustrated in FIG. 7, the lasing action takes place between the electron states at the edge of the first minigap. Owing to the high oscillator strength inherent to the zone-boundary optical transition and the fast intra-miniband electron relaxation and transport, one obtains an efficient depopulation of the uppermost electronic states in the lower miniband. Despite the large transition matrix element and the efficient population inversion, the inter-miniband emission spectrum is considerably broader than the intersubband spectrum of ISL, and hence elaborate heterostructure design is required to achieve high-performance lasing (see Tredicucci et al., Applied Physics Letters, V. 73, No. 15, pp. 2101–2103, 1998; and Tredicucci et al., Applied Physics Letters, V. 74, No. 5, pp. 638–640, 1999).

Figure 8:
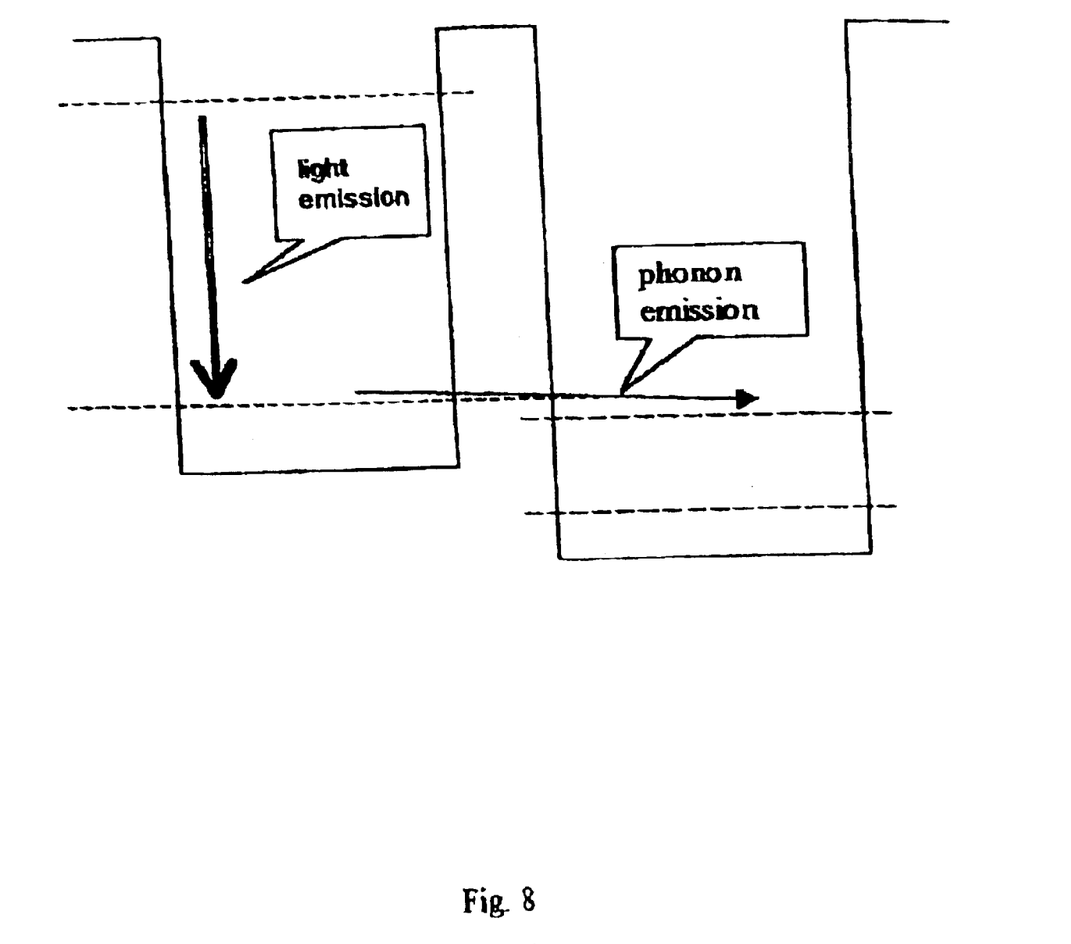
FIG. 8 shows an eighth prior art depopulation mechanism.

Recently, Harrison suggested to use the LO-phonon assisted scattering into a strongly couple subband of a double quantum well (see Harrison, Semiconductor Science and Technology, V. 12, No. 11, pp. 1487–1490, 1997). This method of lower level depopulation in the ISL employs the enhanced wavefunction overlap between electron states in energy-aligned subbands (proximity depopulation) and is illustrated in FIG. 8. In order to obtain the energy alignment, Harrison suggested using an asymmetric double quantum well heterostructure with different well material compositions. The lower laser level in the active QW and the drain level in the adjacent QW are designed to be close to the anticrossing condition and further tuned by the application of an external electric field. Proximity depopulation does not affect directly the electron states near the bottom of the depopulated subband, which are involved into a lasing transition. Only LO-phonon emission from the thermally excited high-energy tail of the electron distribution in the depopulated subband participates in the proximity-enhanced interwell transitions. This feature both limits the depopulation rate and introduces a strong temperature dependence of the depopulation process. Hu proposed to use a coherent control of the LO-phonon emission rate by an external microwave field to improve the inverse population ration in double-QW ISL heterostructures with anticrossing lower energy levels (see Hu et al., Applied Physics Letters, V. 73, No. 7, pp. 876–878, 1998). This method is of limited practical use since it requires an external source of microwave radiation.

SUMMARY OF THE INVENTION

The prior art discussed above encounter several problems which are overcome by this present invention. These known devices are subject to slow intrawell intersubband relaxation times due to the large momentum transfer. Furthermore, small wave-function overlap of the initial and final electron states in interwell transitions can lead to weak intersubband population inversion.

The present invention overcomes problems encountered by prior semiconductor devices by providing a mechanism that significantly enhances phonon-assisted depopulation.

It is, therefore, an objective of this invention to provide a depopulation mechanism, for semiconductor devices, which allows for small momentum transfer in the intersubband electron-phonon resonance with the substantial wave-function overlap characteristic of the intersubband scattering.

It is another objective of this invention to provide a semiconductor device which has a quantum well system that includes a double quantum well active region.

It is yet another objective of this invention to provide an intersubband semiconductor laser (ISL) device having a double quantum well active region which provides rapid depopulation with strong intersubband population inversion.

DETAILED DESCRIPTION OF THE INVENTION

The present invention significantly enhances the population inversion between the upper and lower lasing level of a semiconductor device. The preferred embodiment of this type of device includes intersubband semiconductor lasers (ISLs).

Figure 9:
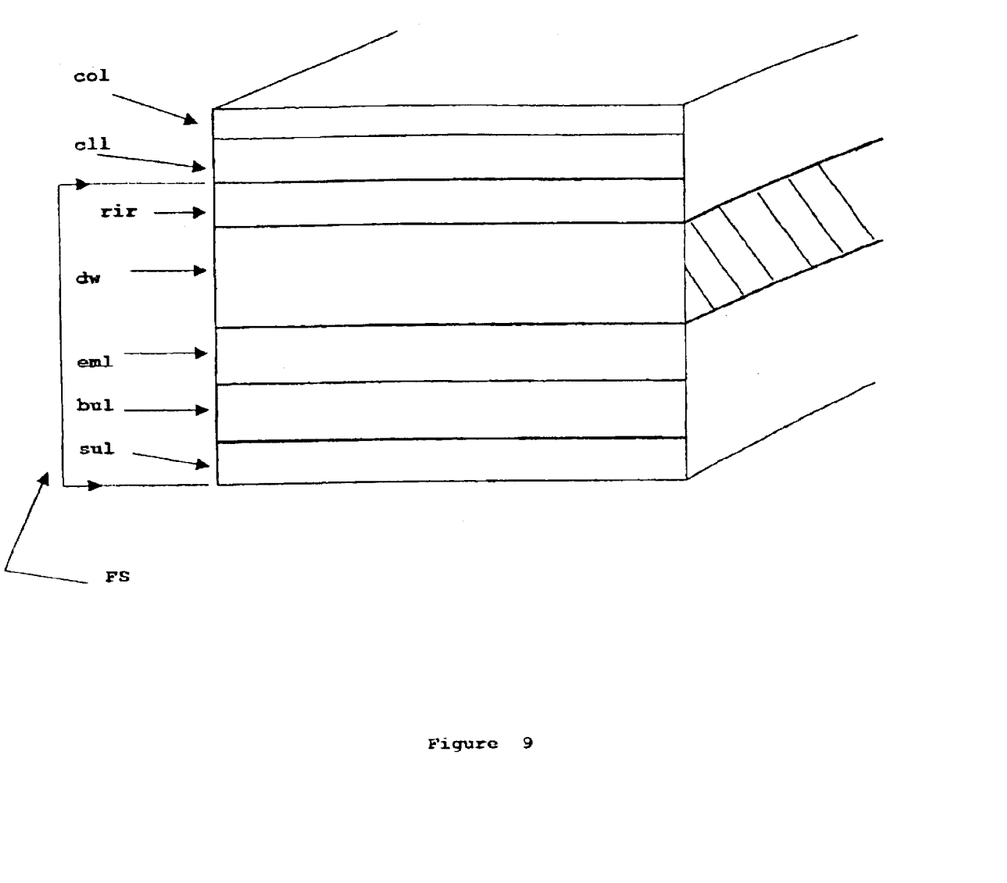
FIG. 9 shows the semiconductor device of the present invention.

FIG. 9 shows the layer structure of the semiconductor device. The base layer is a conductive InP substrate, (sul). A buffer layer (bul) is positioned upon the substrate layer. A InGaAs emitter layer (eml) is positioned upon the buffer layer (bul). Thereafter, a double quantum well active region (dqw) is positioned thereupon. A relaxation/injection region (rir) is located adjacent to the well. The first section (FS) of the substrate can be repeated numerous times, as necessary for the technology where the semiconductor device of the present invention is applied. Current growth technology would benefit from the first section (FS) being repeated 25 times. This first section (FS) of the substrate can be repeated up to 25×. Thereafter, an InAlAs cladding layer (cll) is positioned thereupon. A InGaAs top contact layer (col) completes the semiconductor structure.

Figure 10:
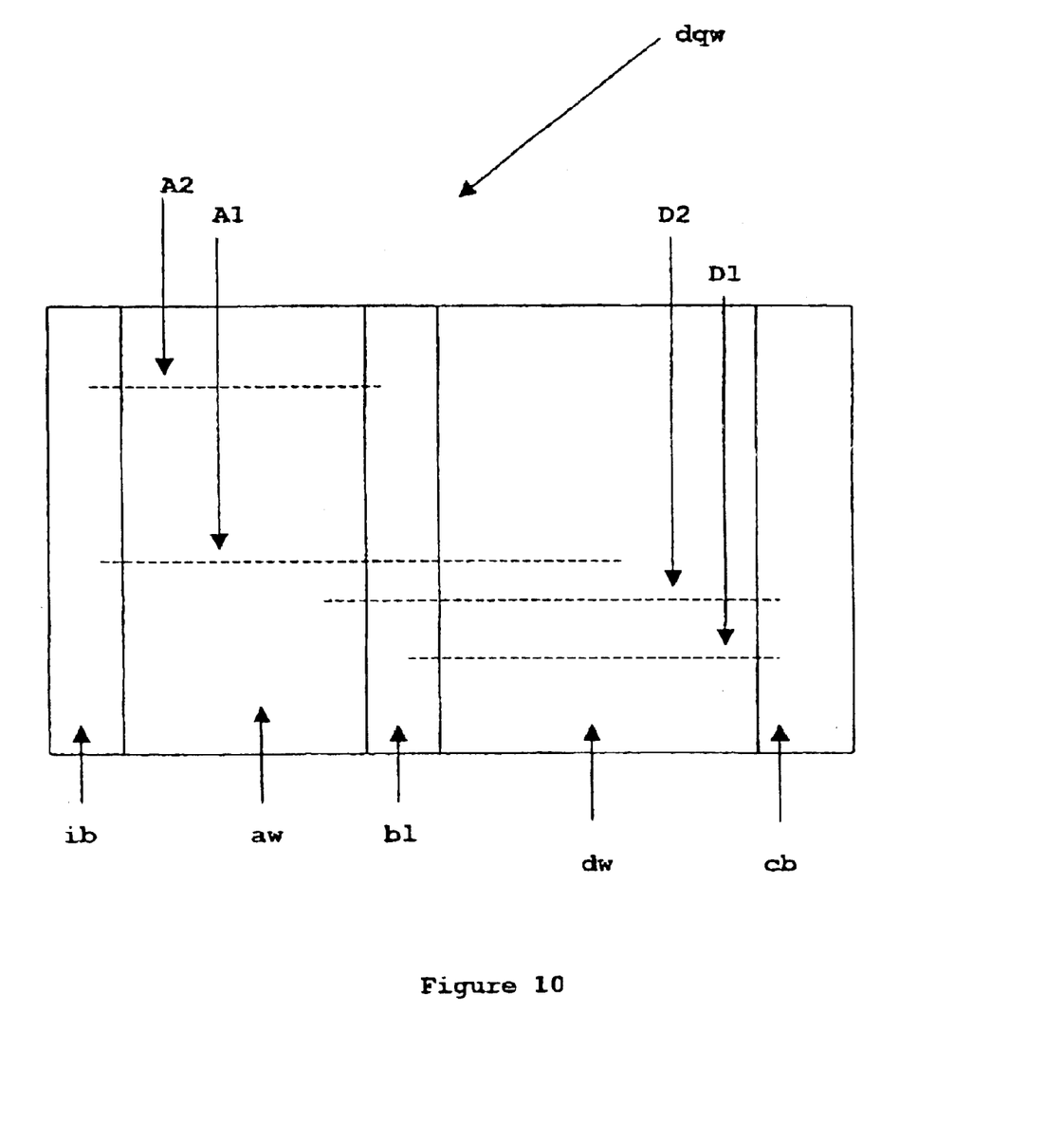
FIG. 10 shows the double quantum well active region of the present invention.

FIG. 10 shows the double quantum well active region (dqw) of FIG. 9, described hereinabove. The dqw is composed of a collector barrier (cb), with a drain quantum well (dw) positioned adjacent to it. An intermediate barrier layer (bl) is positioned adjacent to the (dw), and an active quantum well (aw) is positioned adjacent to the (bl). An injector barrier layer (ib) completes the dqw region.

As shown in FIG. 10, the overall quantum region includes an upper laser level A2 and a lower laser level A1. Laser action is initiated by injecting a current of electrons or carriers into A2 which then emits laser photons as the carriers transition from A2 to A1.

Here as in standard ISLs, it is desirable to increase the ratio of the carrier (electrons or hole) population in level A1 to the level A2. It is important to increase the ratio of carriers because this enhances the population inversion between the upper and lower lasing level of the ISL. By raising the ratio, the gain is enhanced and the intensity of the laser radiation is also enhanced. The same gain may be achieved with a shorter active laser region, when a more compact laser is desired. Alternatively, the same gain may also be achieved with reduced levels of pump power.

A particular feature of this invention is that a second quantum well, (d, not shown), is grown adjacent to a lasing region (A, not shown) that has an energy level, D1, which is lower than level A1 by the energy of a typical phonon in the semiconductor structure used to fabricate the laser. Note here that the second quantum well and the lasing region are determined by semiconductor materials.

Since the difference between the energies of level A1 and D1 is equal to the energy of a phonon, level A1 is depopulated by the process where a carrier in level A1 leaves level A1 and occupies level D1 as it emits a phonon.

This phonon-assisted transition can be enhanced greatly by designing a laser structure of FIG. 9 so that the widths of the quantum wells (A, not shown) and lasing region (D, not shown), and their energy depths are such that the energies of A1 and D1 differ by exactly the energy of one phonon that efficiently takes part in the phonon-assisted process, described above. Note again, that the widths of the quantum well and lasing region is dependent upon semiconductor materials chosen and the one phonon energy difference between A1 and D1 will be dependent upon the semiconductor materials.

The phonon-assisted transition can be further enhanced when energy levels A1 and D2 have nearly the same energy. When these conditions of resonance are met, the ratio of the populations between levels A1 and A2 can be enhanced by at least a factor of This increased factor, represents a major improvement over standard ISL's, since the gain of the laser is proportional to the exponential power of the population inversion ratio. This population inversion ratio can be determined by the following equation:

$$\eta_{loc}=(\eta_{A2}/\eta_{A1})_{k=0}\approx\eta_{tot}(1+\tau_{11}/\tau_{out})^{E_{A2-A1}/\hbar\omega_{ph}}$$

where $\eta_{loc}$ is the local population inversion, $\eta_{A2}$ is the population of carriers at A2, $\eta_{A1}$ is the population of carriers at A1, $\eta_{tot}$ is the total subband carrier population ratio, $\tau_{11}$ is the transition rate and $\tau_{out}$ is the depopulation rate.

Figure 11:
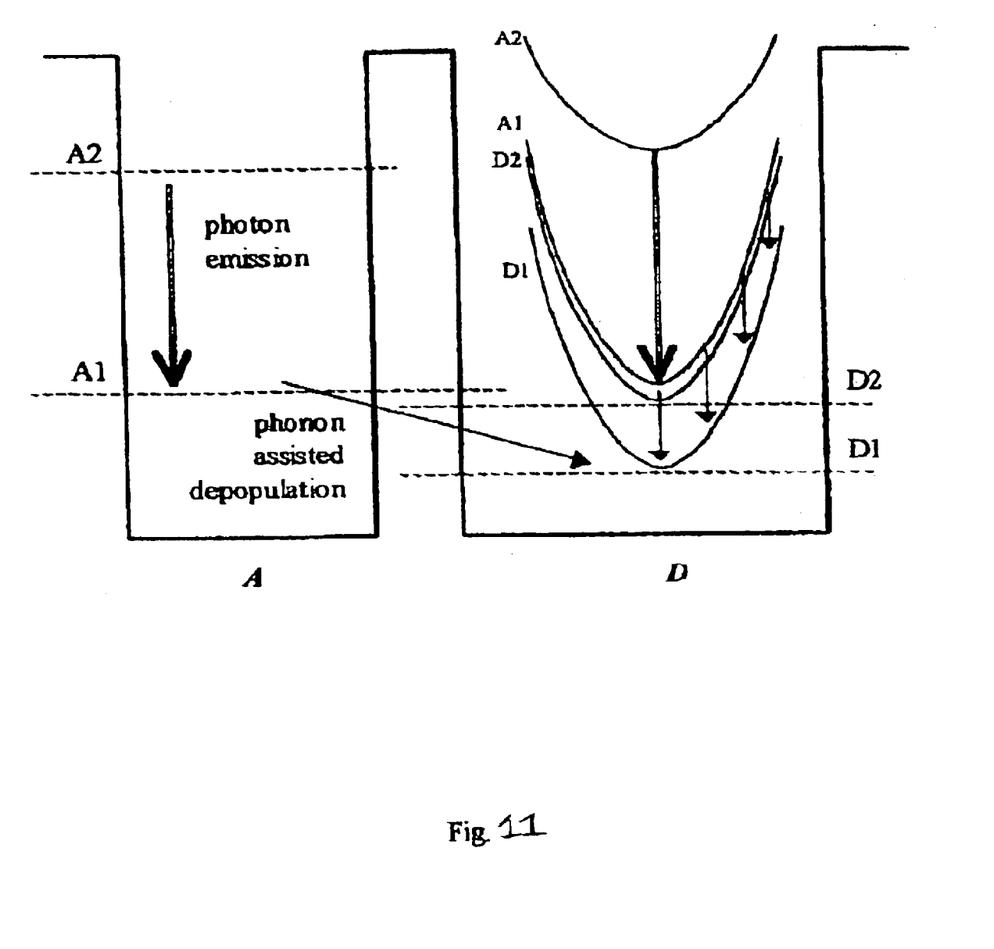
FIG. 11 shows a graph of the interfaces of the semiconductor structure vs. energy of the present invention.

As shown in FIG. 11, the horizontal axis represents the space coordinate perpendicular to the interfaces (heterointerfaces) of the semiconductor structure used to make the intersubband laser. The vertical axis represents energy. The present depopulation system requires the A1 subband of the active quantum well A to be resonantly aligned with the second subband D2 of the adjacent drain quantum well (dw), while the subband separation D2-D1 in that well is in resonance with the LO phonon. Predicted enhancement of the depopulation process is related with the resonant penetration of the wave function of the depopulated electron state A1 into the drain quantum well D under the A1-D2 subband anticrossing condition. This results in the increase of the overlap between initial A1 and final D1 electron states of an interwell transition and leads to a significant increase of the depopulation rate. The proposed depopulation process combines the advantage of the small momentum transfer in the traditional intersubband electron-phonon resonance with the benefit of a substantial wavefunction overlap characteristic of the resonant tunneling and the proximity depopulation processes.

A further advantage of this invention lies in the fact that the increase of the depopulation rate due to the A1-D2 anticrossing is accompanied by a reduction of the nonradiative A2-A1 transition rate. The latter decreases for the same reason, namely due to the abrupt reduction of the intrawell electron overlap, when A1 states penetrate into the drain quantum well D due to the A1-D2 resonant alignment. The decrease of the nonradiative relaxation between the levels A2 and A1 will further increase the inverse population ratio between these levels, thus facilitating the intersubband inverse population, enhancing the output power and lowering the threshold circuit.

The depopulation rate, which can be achieved in the proposed process, is one order of magnitude larger than the maximum transition rate at the onset of LO-phonon assisted transitions employed in contemporary ISL. In contrast to the traditional design of injection intersubband lasers, this approach assumes the drain quantum well (dw) to be wider than the active quantum well (aw).

What is claimed is:

1. A method for enhancing phonon assisted transitions in a semiconductor device comprising:

forming an active quantum well structure containing a final electron energy subband for an optical lasing transition and a drain quantum well structure for collecting electrons after a lasing transition;

injecting carriers into the active quantum well structure which emit laser photons as the carriers transition from a higher energy subband to the final energy subband within the active quantum well;

depopulating the carriers from the final energy subband of the active quantum well structure to an energy subband of the drain quantum well structure; and transitioning the carriers from the energy subband of the drain quantum well structure to a lower energy subband within the drain quantum well structure separated in energy from the energy subband of the drain quantum well structure by at least one quantum of optical phonon energy to thereby emit laser photons.

2. A method for enhancing phonon assisted transitions in a semiconductor device as recited in claim 1, wherein the energy subband of the drain quantum well structure has substantially the same energy level as that of the final energy subband of the active quantum well structure.

3. A method for enhancing phonon assisted transitions in a semiconductor device as recited in claim 1 wherein the semiconductor device is a heterostructure and the step of forming provides a plurality of active quantum well structures, each containing a final electron energy subband for an optical lasing transition, and a plurality of drain quantum well structures for collecting electrons after a lasing transition.

4. A method for enhancing phonon assisted depopulation of the final electron energy subband for an optical lasing transition in a semiconductor laser comprising:

forming a heterostructure including an active quantum well structure containing said final electron energy subband for an optical lasing transition and a drain quantum well structure for collecting electrons after said lasing transition;

injecting carriers into the active quantum well structure which emit laser photons as the carriers transition from a higher energy subband to the final energy subband within the active quantum well structure;

depopulating the carriers from the final energy subband of the active quantum well structure to an energy subband of the drain quantum well structure having substantially the same energy level as that of the final energy subband of the active quantum well structure; and transitioning the carriers from said energy subband of the drain quantum well structure to a lower energy subband within the drain quantum well structure separated in energy from the energy subband of the drain quantum well structure by at least one quantum of optical phonon energy to thereby emit laser photons.

5. A method for enhancing phonon assisted depopulation of a final electron energy subband for an optical lasing transition in a semiconductor device having an active quantum well containing the final electron energy subband for an optical lasing transition and a drain quantum well for collecting electrons after said lasing transition comprising:

injecting carriers into the active quantum well which emit laser photons as the carriers transition from a higher energy subband to the final energy subband within the active quantum well;

depopulating the carriers from the final energy subband of the active quantum well to an energy subband of the drain quantum well; and transitioning the carriers from the energy subband of the drain quantum well to a lower energy subband within the drain quantum well separated in energy from the energy subband of the drain quantum well by at least one quantum of optical phonon energy to thereby emit laser photons.

6. A method for enhancing phonon assisted transitions in a semiconductor device as recited in claim 5 wherein the energy subband of the drain quantum well has substantially the same energy level as that of the final energy subband of the active quantum well.

* * * * *